US012743028B2

(12) United States Patent
Chen et al.

(10) Patent No.: US 12,743,028 B2
(45) Date of Patent: Sep. 22, 2026

(54) RETICLE CLAMPING MODULE

(71) Applicant: GUDENG EQUIPMENT CO., LTD., New Taipei City (TW)

(72) Inventors: Yu-Lin Chen, New Taipei City (TW); Bing-Hong Tsai, New Taipei City (TW); Wei-Chen Wang, New Taipei City (TW)

(73) Assignee: GUDENG EQUIPMENT CO., LTD., New Taipei City (TW)

( * ) Notice: Subject to any disclaimer, the term of this patent is extended or adjusted under 35 U.S.C. 154(b) by 133 days.

(21) Appl. No.: 18/977,975

(22) Filed: Dec. 12, 2024

(65) Prior Publication Data

US 2025/0199420 A1 Jun. 19, 2025

(30) Foreign Application Priority Data

Dec. 14, 2023 (TW) ................................ 112148765

(51) Int. Cl.
*G03F 7/00* (2006.01)
*G03F 1/66* (2012.01)

(52) U.S. Cl.
CPC ............ *G03F 7/70741* (2013.01); *G03F 1/66* (2013.01); *G03F 7/7085* (2013.01); *G03F 7/70916* (2013.01); *G03F 7/7095* (2013.01); *G03F 7/70991* (2013.01)

(58) Field of Classification Search
CPC ........ G03F 1/66; G03F 7/707; G03F 7/70741; G03F 7/7085; G03F 7/70916; G03F 7/7095; G03F 7/70991
See application file for complete search history.

(56) References Cited

U.S. PATENT DOCUMENTS 6,040,096 A * 3/2000 Kakizaki ............. G03F 7/70358 355/68
8,885,149 B2 * 11/2014 Amin-Shahidi ........ G03F 7/707 355/75
10,274,844 B1 * 4/2019 Chung ................ G03F 7/70533
2002/0043163 A1 * 4/2002 Novak .................... G03F 7/707 101/131
2003/0227605 A1 * 12/2003 del Puerto ............. B82Y 10/00 355/75
2004/0080730 A1 * 4/2004 Binnard ................. G03B 27/42 355/53
2010/0195081 A1 * 8/2010 Del Puerto ............ G03F 7/707 355/72
2011/0007297 A1 * 1/2011 Koike .................... G03B 27/64 355/76

* cited by examiner

*Primary Examiner* — Deoram Persaud

(57) ABSTRACT

A reticle clamping module includes two clamping mechanisms and a plurality of anti-slip filler members. The two clamping mechanisms are disposed opposite to each other to form a reticle space. Each of the two clamping mechanisms includes a clamping member and a power member. A reticle contact surface of the clamping member is provided with a first groove, the power member is disposed at a back surface of the clamping member opposite to the reticle contact surface to push the clamping member to reciprocate, and the plurality of anti-slip filler members are respectively disposed in the first grooves of the two clamping mechanisms. The reticle clamping module of the present disclosure is capable of securely clamping and preventing damage of a reticle, as well as preventing the reticle from scratches or inappropriate forces applied thereupon.

8 Claims, 4 Drawing Sheets

RETICLE CLAMPING MODULE

BACKGROUND OF THE INVENTION

1. Field of the Invention

The present disclosure relates to a reticle clamping module, and in particular to a damage-resistant reticle clamping module.

2. Description of the Related Art

In a semiconductor lithography process, a reticle is used to duplicate a pattern onto a wafer. Therefore, the storage and cleanliness of reticles are critical. In general, an automated apparatus such as a mechanical arm is needed to clamp and move a reticle according to a specified means, so as to prevent the reticle from damage or contamination of external dust and chemical substances. Generally speaking, a reticle is better prevented from scratches as a contact area between a mechanical arm and the reticle gets smaller. However, an overly small contact area may also cause unstable clamping and thus damage the reticle.

BRIEF SUMMARY OF THE INVENTION

Therefore, in order to solve the numerous issues of a conventional reticle clamping module, the present disclosure provides a damage-resistant reticle clamping module.

To achieve the above and other objectives, the present disclosure provides a reticle clamping module. The reticle clamping module includes: two clamping mechanisms, disposed opposite to each other to form a reticle space, each of the two clamping mechanisms including a clamping member and a power member, wherein a reticle contact surface of the clamping member is provided with a first groove, and the power member is disposed at a back surface of the clamping member opposite to the reticle contact surface to push the clamping member to reciprocate; and a plurality of anti-slip filler members, respectively disposed in the first grooves of the two clamping mechanisms.

In one embodiment of the present disclosure, the reticle contact surface extends along a direction of gravity, and each of the two clamping mechanisms further includes a protective bottom plate connected to the clamping member and extending perpendicular to the reticle contact surface.

In one embodiment of the present disclosure, the protective bottom plate is provided with a second groove. The second groove is in communication with the first groove, and the plurality of anti-slip filler members extend from the first groove to the second groove.

In one embodiment of the present disclosure, a detection mechanism disposed on one of the protective bottom plates is further included.

In one embodiment of the present disclosure, a control mechanism signally connected to the detection mechanism is further included.

In one embodiment of the present disclosure, each of the two clamping mechanisms includes two of the clamping members, and each of the clamping members is provided with two of the first grooves.

In one embodiment of the present disclosure, each of the two clamping mechanisms further includes a shield member disposed at the back surface, and the power member is disposed in the shield member.

In one embodiment of the present disclosure, an optical sensing mechanism is further included. The optical sensing mechanism faces the reticle space to detect whether a reticle is present in the reticle space.

Thus, the reticle clamping module of the present disclosure is capable of securely clamping and preventing damage of a reticle. Meanwhile, the reticle can be in contact with soft and highly elastic anti-slip filler members to prevent the reticle from damage caused by scratches or inappropriate forces applied thereupon.

DETAILED DESCRIPTION OF THE INVENTION

To fully understand the present disclosure, the present disclosure is described in detail by way of specific embodiments with the accompanying drawings below. A person skilled in the art would be able to understand the objectives, features and effects of the present disclosure on the basis of the disclosure of the present application. It should be noted that, the present disclosure may be implemented or applied by other specific embodiments, and changes and modifications may also be made on the basis of different perspectives and applications to various details in the description without departing from the spirit of the present disclosure. Technical contents associated with the present disclosure are described in detail below, and it should be noted that the disclosure is not intended for limiting the scope of claims of the present disclosure. Associated details are provided in the description below.

Figure 1:
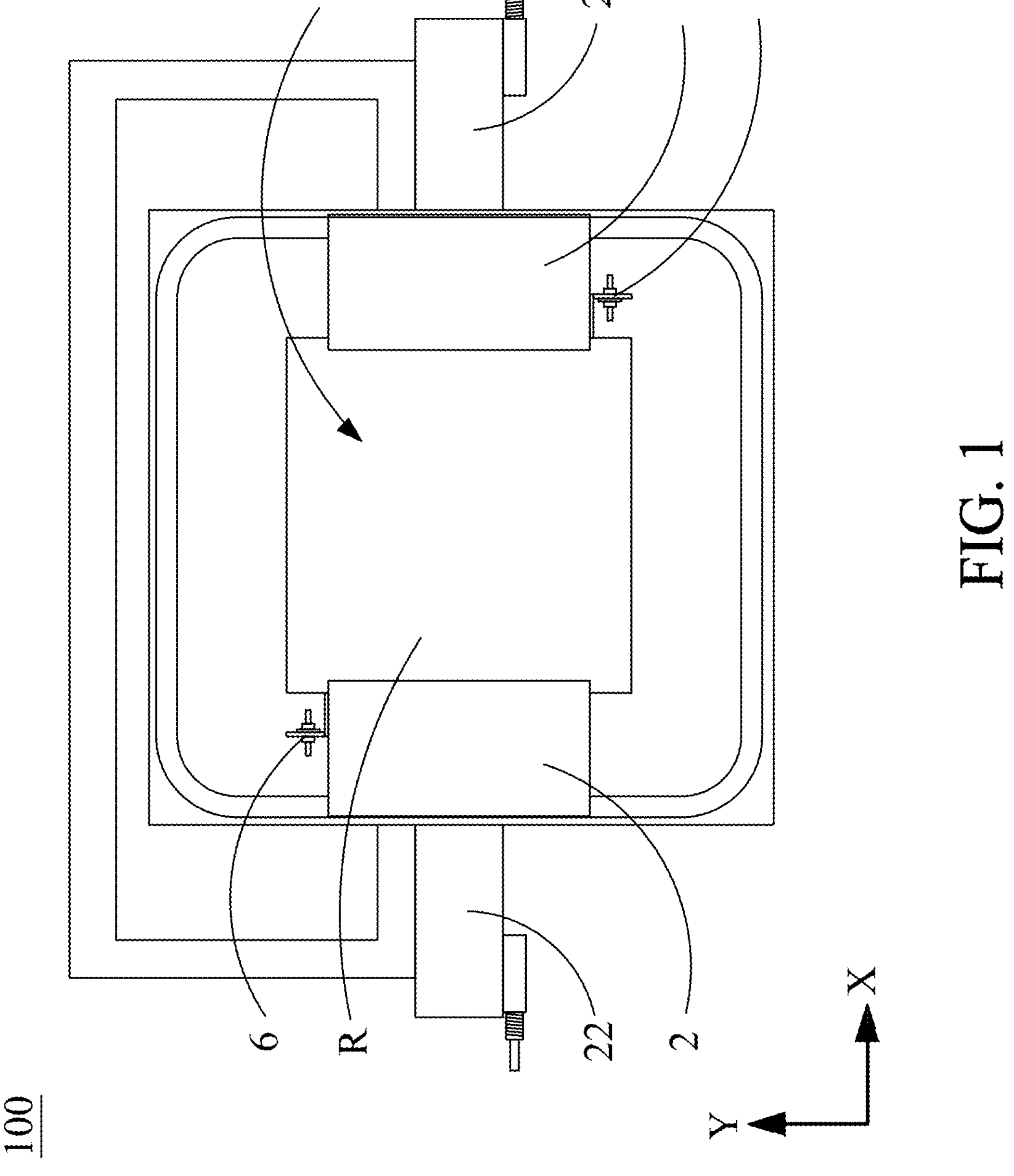
FIG. 1 is a top view of a reticle clamping module according to an embodiment of the present disclosure.
Figure 2:
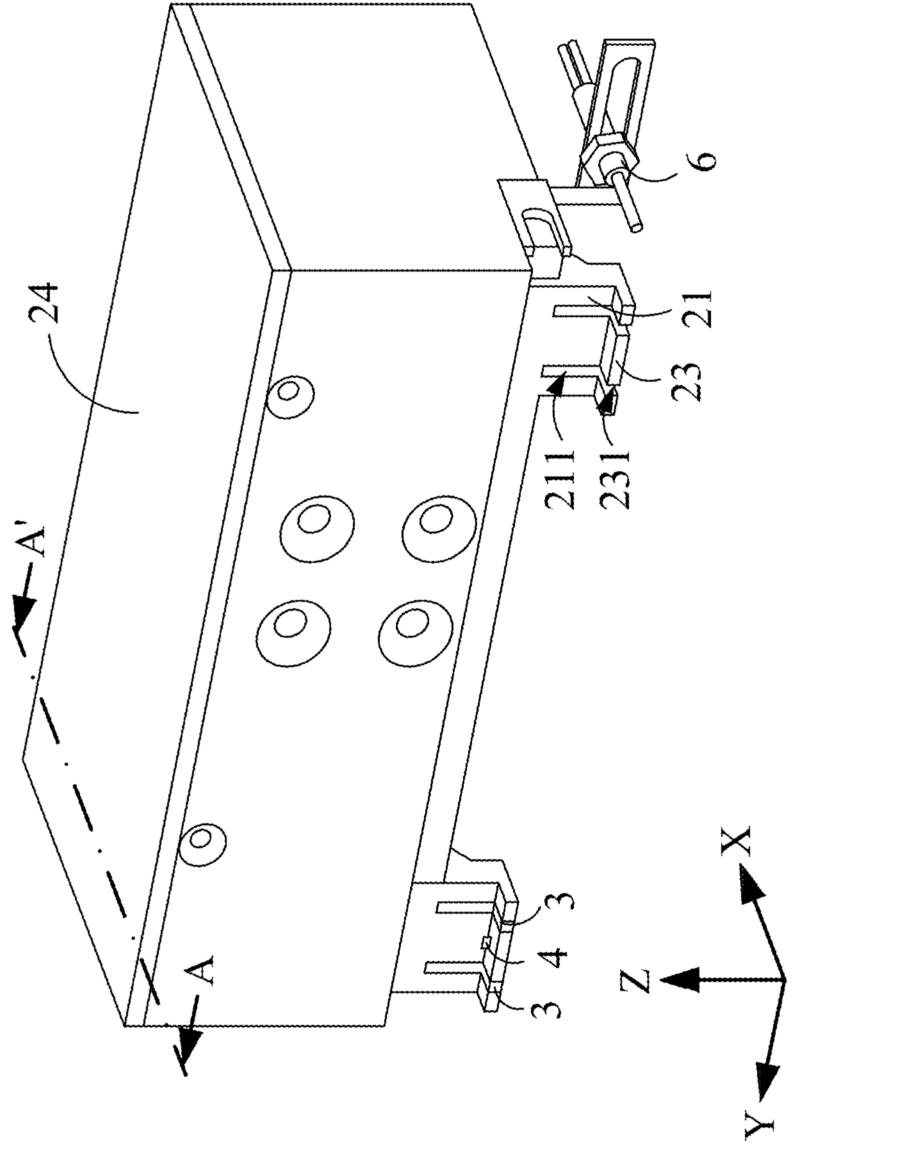
FIG. 2 is a perspective schematic diagram of a clamping mechanism according to an embodiment of the present disclosure.
Figure 3:
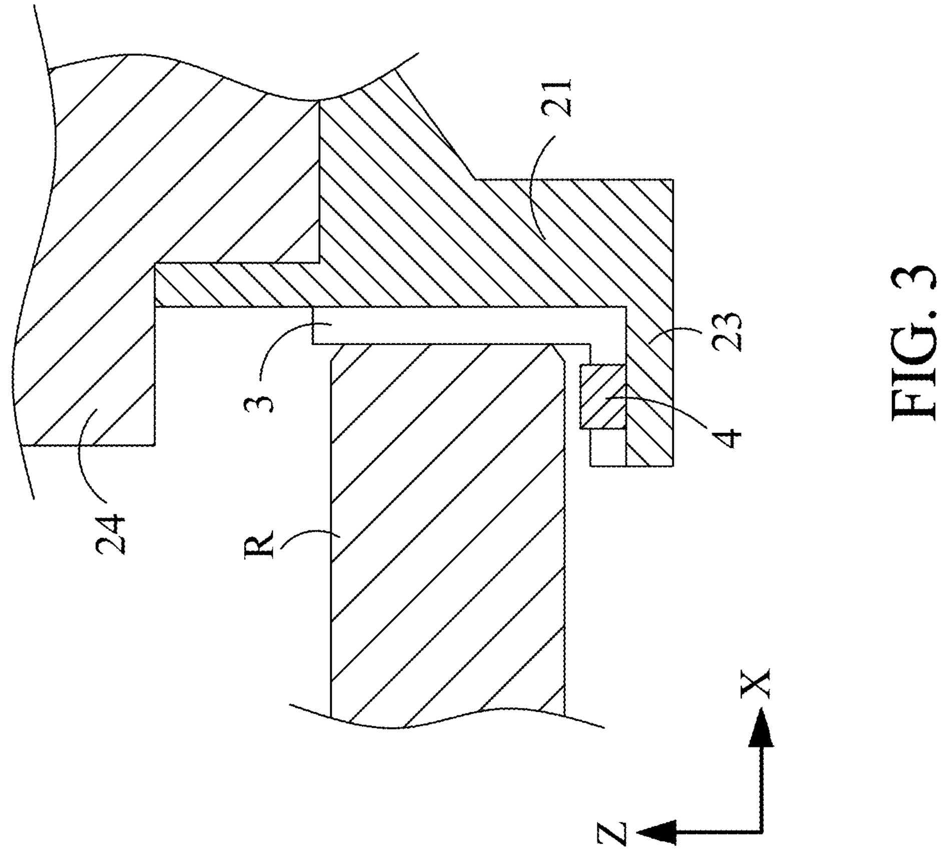
FIG. 3 is a cross-sectional schematic diagram of a clamping mechanism according to an embodiment of the present disclosure.

As shown in FIG. 1 to FIG. 3, a reticle clamping module 100 according to an embodiment of the present disclosure includes two clamping mechanisms 2 and a plurality of anti-slip filler members 3.

The two clamping mechanisms 2 are disposed opposite to each other to form a reticle space S, wherein the reticle space S is for accommodating a reticle R. The two clamping mechanisms 2 clamp the reticle R from both sides of the reticle R. Each of the two clamping mechanisms 2 includes a clamping member 21 and a power member 22.

As shown in FIG. 2, the clamping member 21 has a reticle contact surface for contacting with and fixing the reticle R in a clamping manner. Preferably, the clamping member 21 is made of a wear-resistant (less likely generating particles or dust) material less prone to static electricity. In this embodiment, the clamping member 21 has a planar shape, and the reticle contact surface extends along a direction of gravity (Z axis); however, the present disclosure is not limited to the examples above. In other embodiments, the clamping member 21 may be in other appropriate shapes.

The power member 22 is disposed at a back surface of the clamping member 21 opposite to the reticle contact surface to push the clamping member 21 to reciprocate. The power member 22 is, for example, a device such as a motor or an electric cylinder capable of providing power for reciprocation, and can preferably be controlled by an electrical signal to control the movement stroke.

As shown in FIG. 2, the reticle contact surface of the clamping member 21 is provided with a first groove 211, and the plurality of anti-slip filler members 3 are respectively disposed in the first grooves 211 of the two clamping mechanisms 2. For better understanding, the clamping mechanism 2 shown in FIG. 2 includes two clamping members 21, wherein the first groove 211 of one of the clamping members 21 is provided with the anti-slip filler member 3, while the anti-slip filler member 3 in the first groove 21 in the other clamping member 21 is hidden so as to clearly show the appearance of the first groove 21.

FIG. 3 shows a cross-sectional diagram taken along the section line A-A' in FIG. 2. As shown in FIG. 3, the anti-slip filler member 3 is an element physically in contact with the reticle R. The anti-slip filler member 3 is made of, for example, a soft and elastic material capable of providing appropriate buffering (such as rubber). Preferably, the anti-slip filler member 3 clamps the reticle R in a manner of being in line contact, so as to reduce a contact area with the reticle R and to be able to completely clamp the reticle R to prevent the reticle R from falling off.

In conclusion, by clamping the both sides of the reticle R by two clamping mechanisms 2 and the plurality of anti-slip filler members 3, the reticle clamping module 100 of the present disclosure is capable of securely clamping and preventing damage of the reticle R. Meanwhile, the reticle R can be in contact with soft and highly elastic anti-slip filler members 3 to prevent the reticle R from damage caused by scratches or inappropriate forces applied thereupon.

Further, as shown in FIG. 2, each of the two clamping mechanisms 2 further includes a protective bottom plate 23, which is connected to the clamping member 21 and extends perpendicular to the reticle contact surface. The purpose of providing the protective bottom plate 23 is to provide the reticle R with further protection. The protective bottom plate 23 can bear the reticle R accidentally falling off from the clamping member 21, so as to prevent the reticle R from damage in case the reticle R falls off from a high place. In a normal operation state, the protective bottom plate 23 is not in direct contact with the reticle R (refer to FIG. 3).

Further, as shown in FIG. 2, the protective bottom plate 23 is provided with a second groove 231. The second groove 231 is in communication with the first groove 211, and the plurality of anti-slip filler members 3 extend from the first groove 211 to the second groove 231. On the basis of the same principle, if the reticle R unexpectedly falls onto the protective bottom plate 23, the extending anti-slip filler members 3 serve as elements that physically come into contact with the reticle R, such that the elasticity of the anti-slip filler members 3 can serve as a buffer against falling and reduce the contact area with the reticle R.

Further, as shown in FIG. 2 and FIG. 3, the reticle clamping module 100 further includes a detection mechanism 4 disposed on at least one of the protective bottom plates 23. The detection mechanism 4 is for detecting whether there is any reticle R that unexpectedly falls onto the protective bottom plate 23. The detection mechanism 4 is, for example, an optical detection mechanism, which detects a distance to the reticle R by an optical signal emitted to thereby determine whether there is any reticle R that unexpectedly falls onto the protective bottom plate 23. The detection mechanism 4 may also be a detection mechanism based on mechanical principles, and determine, by if it is triggered by a force received, whether there is any reticle R that unexpectedly falls onto the protective bottom plate 23.

The detection mechanism 4 may further be a detection mechanism based on electrical or magnetic principles, and determine, by if there is a change in electric properties or a magnetic field, whether there is any reticle R that unexpectedly falls onto the protective bottom plate 23. The present disclosure does not define the type of the detection mechanism 4, and any detection mechanism capable of detecting falling of the reticle R onto the protective bottom plate 23 may serve as the detection mechanism 4 of the present disclosure.

Figure 4:
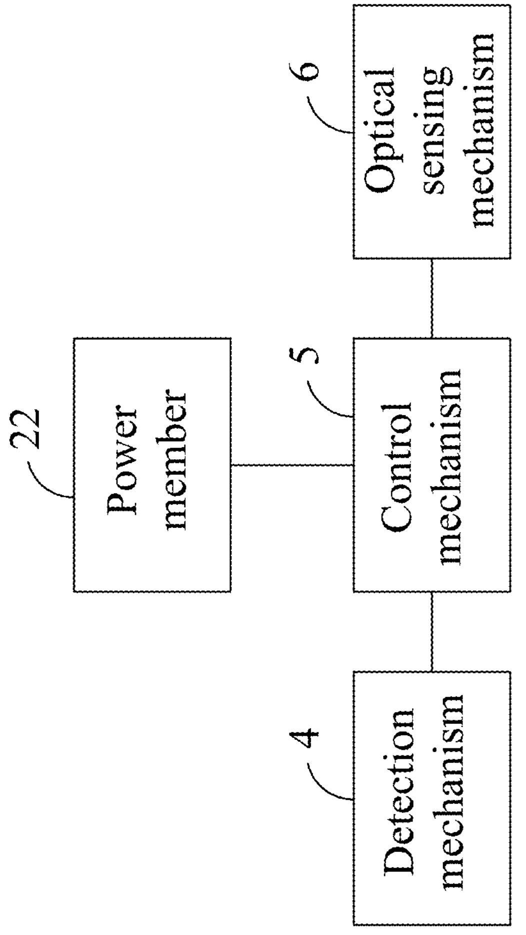
FIG. 4 is a block diagram of a reticle clamping module according to an embodiment of the present disclosure.

Further, as shown in FIG. 4, the reticle clamping module 100 further includes a control mechanism 5 signally connected to the detection mechanism 4 and the power member 22. The control mechanism 5 determines the travel distance of the power member 22 according to a detection signal of the detection mechanism 4. The control mechanism 5 is, for example, a chip or a circuit with logic determination ability, and may be integrated into a computer or a human-machine interface (HMI).

Further, as shown in FIG. 2, each of the two clamping mechanisms 2 includes two clamping members 21, and each of the clamping members 21 is provided with two first grooves 211. However, the present disclosure is not limited to the examples above. The number of the clamping members 21 included in one clamping mechanism 2 is not specifically defined, and the number of the first grooves 211 included in each of the clamping members 21 is likewise not specifically defined. The numbers of the clamping members 21 and the first grooves 211 may be adjusted according to requirements.

Further, as shown in FIG. 1 and FIG. 2, each of the two clamping mechanisms 2 further includes a shield member 24. The shield member 24 is disposed at the back surface of the clamping member 21, and the power member 22 is disposed in the shield member 24. The shield member 24 is preferably in the form of a box, so as to accommodate the power member 22 and separate the power member 22 from the clamping member 21 and the reticle R. The power member 22 is fixedly connected to the shield member 24 and the clamping member 21. For example, the clamping member 21, the shield member 24 and the power member 22 may be sequentially fixed in a locked manner so as to achieve the fixed connection of the three. The power member 22 pushes the shield member 24 and the clamping member 21 to reciprocate, such that the clamping member 21 may release or clamp the reticle R. The shield member 24 keeps the clamping member 21 and the reticle R free from possible dust contamination generated by the power member 22.

Moreover, the reticle clamping module 100 further includes an optical sensing mechanism 6, which is signally connected to the control mechanism 5 and disposed to face the reticle space S and is for detecting whether a reticle is present in the reticle space S. The optical sensing mechanism 6 is, for example, a reflective infrared sensor or a through-beam infrared sensor. If a reflective infrared sensor is used, an emitting element and a receiving element may be disposed on the same side of the reticle R, so as to determine by reflected light signals whether the reticle R is present in the reticle space S. If a through-beam infrared sensor is used, an emitting element and a receiving element are respectively disposed on opposite sides of the reticle R (for example, disposed at the other clamping mechanism 2). If there are two or more optical sensing mechanisms 6 that are through-beam infrared sensors, the positions thereof need to be staggered. However, the present disclosure is not limited to the examples above. In other embodiments, optical sensing mechanisms based on other principles or other types of optical sensing mechanisms may be used.

In this embodiment, each of the two clamping mechanisms 2 further includes a dust suction member (not shown) disposed in the shield member 24. The dust suction member is disposed outside the power member 22 and is located in the shield member 24 to further assist in drawing away possible dust contamination generated by the power member 22, so as to prevent dust from leaking through an opening of the shield member 24.

The present disclosure is described by way of the embodiments above. A person skilled in the art should understand that, the embodiments are merely for illustrating the present disclosure and are not to be construed as limitations to the scope of the present disclosure. It should be noted that all equivalent changes, replacements and substitutions made to the embodiments are encompassed within the scope of the present disclosure. Therefore, the legal protection for the present disclosure should be defined by the appended claims.

What is claimed is:

1. A reticle clamping module, comprising:

two clamping mechanisms, disposed opposite to each other to form a reticle space, each of the two clamping mechanisms comprising a clamping member and a power member, wherein a reticle contact surface of the clamping member is provided with a first groove, and the power member is disposed at a back surface of the clamping member opposite to the reticle contact surface to push the clamping member to reciprocate; and a plurality of anti-slip filler members, respectively disposed in the first grooves of the two clamping mechanisms.

2. The reticle clamping module according to claim 1, wherein the reticle contact surface extends along a direction of gravity, and each of the two clamping mechanisms further comprises a protective bottom plate connected to the clamping member and extending perpendicular to the reticle contact surface.

3. The reticle clamping module according to claim 2, wherein the protective bottom plate is provided with a second groove, the second groove is in communication with the first groove, and the plurality of anti-slip filler members extend from the first groove to the second groove.

4. The reticle clamping module according to claim 2, further comprising a detection mechanism disposed on at least one of the protective bottom plates.

5. The reticle clamping module according to claim 4, further comprising a control mechanism signally connected to the detection mechanism.

6. The reticle clamping module according to claim 1, wherein each of the two clamping mechanisms comprises two of the clamping members, and each of the clamping members is provided with two of the first grooves.

7. The reticle clamping module according to claim 1, wherein each of the two clamping mechanisms further comprises a shield member disposed at the back surface, and the power member is disposed in the shield member.

8. The reticle clamping module according to claim 1, further comprising an optical sensing mechanism facing the reticle space to detect whether a reticle is present in the reticle space.

* * * * *